(12) United States Patent
Sills et al.

(10) Patent No.: US 11,515,417 B2
(45) Date of Patent: Nov. 29, 2022

(54) TRANSISTORS INCLUDING HETEROGENEOUS CHANNELS

(71) Applicant: Micron Technology, Inc., Boise, ID (US)

(72) Inventors: Scott E. Sills, Boise, ID (US); Ramanathan Gandhi, Boise, ID (US); Durai Vishak Nirmal Ramaswamy, Boise, ID (US); Yi Fang Lee, Boise, ID (US); Kamal M. Karda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 16/596,448

(22) Filed: Oct. 8, 2019

(65) Prior Publication Data
US 2020/0111908 A1    Apr. 9, 2020

Related U.S. Application Data

(60) Provisional application No. 62/743,075, filed on Oct. 9, 2018.

(51) Int. Cl.
| | | |
|---|---|---|
| *H01L 29/78* | (2006.01) | |
| *H01L 29/10* | (2006.01) | |
| *H01L 29/66* | (2006.01) | |
| *H01L 27/24* | (2006.01) | |

(52) U.S. Cl.
CPC ...... *H01L 29/7827* (2013.01); *H01L 27/2454* (2013.01); *H01L 29/1054* (2013.01); *H01L 29/66969* (2013.01)

(58) Field of Classification Search
CPC ............ H01L 29/7827; H01L 27/2454; H01L 29/78642; H01L 29/66666; H01L 29/1054; H01L 29/66969
See application file for complete search history.

(56) References Cited

U.S. PATENT DOCUMENTS

| | | | |
|---|---|---|---|
| 7,435,987 B1 * | 10/2008 | Chui | ...................... H01L 29/155 257/E29.069 |
| 8,299,516 B2 | 10/2012 | Weng et al. | |
| 8,895,979 B2 | 11/2014 | Chang et al. | |
| 9,082,793 B1 | 7/2015 | Ahmed | |

(Continued)

FOREIGN PATENT DOCUMENTS

| | | |
|---|---|---|
| JP | 2010-177450 A | 8/2010 |
| KR | 10-1113990 B1 | 3/2012 |

(Continued)

OTHER PUBLICATIONS

International Search Report from International Application No. PCT/US2019/055106, dated Jan. 22, 2020, 3 pages.

(Continued)

*Primary Examiner* — Bac H Au
(74) *Attorney, Agent, or Firm* — TraskBritt

(57) ABSTRACT

A transistor comprises a first conductive contact, a heterogeneous channel comprising at least one oxide semiconductor material over the first conductive contact, a second conductive contact over the heterogeneous channel, and a gate electrode laterally neighboring the heterogeneous channel. A device, a method of forming a device, a memory device, and an electronic system are also described.

16 Claims, 9 Drawing Sheets

(56) References Cited

U.S. PATENT DOCUMENTS

| | | | |
|---|---|---|---|
| 9,246,013 | B2 | 1/2016 | Ahmed |
| 9,397,145 | B1 | 7/2016 | Sills et al. |
| 9,620,591 | B2* | 4/2017 | Yu ................ H01L 29/7827 |
| 9,698,272 | B1 | 7/2017 | Ikeda et al. |
| 9,773,888 | B2 | 9/2017 | Pulugurtha et al. |
| 10,461,184 | B1* | 10/2019 | Cheng ............. H01L 21/324 |
| 11,043,587 | B2* | 6/2021 | Balakrishnan ...... H01L 29/1054 |
| 2008/0067495 | A1 | 3/2008 | Verhulst |
| 2011/0147798 | A1 | 6/2011 | Radosavljevic et al. |
| 2012/0045879 | A1 | 2/2012 | Verhulst |
| 2012/0298961 | A1 | 11/2012 | Iacopi et al. |
| 2012/0302015 | A1 | 11/2012 | Mouli |
| 2013/0168671 | A1 | 7/2013 | Koike et al. |
| 2015/0091058 | A1* | 4/2015 | Doyle ............. H01L 29/749 257/192 |
| 2015/0236092 | A1* | 8/2015 | Yu ................ H01L 29/775 257/29 |
| 2016/0027804 | A1 | 1/2016 | Li et al. |
| 2016/0079385 | A1 | 3/2016 | Ellinger et al. |
| 2016/0276440 | A1 | 11/2016 | Avci et al. |
| 2017/0288056 | A1* | 10/2017 | Balakrishnan .... H01L 21/02236 |
| 2018/0090679 | A1 | 3/2018 | Sills et al. |
| 2018/0166457 | A1 | 6/2018 | Colinge et al. |
| 2019/0296155 | A1* | 9/2019 | Sawabe ........... H01L 29/7869 |
| 2020/0335610 | A1* | 10/2020 | Huang ............. H01L 29/205 |

FOREIGN PATENT DOCUMENTS

| | | |
|---|---|---|
| TW | 201727831 A | 8/2017 |
| WO | 2018/063308 A1 | 4/2018 |

OTHER PUBLICATIONS

International Written Opinion from International Application No. PCT/US2019/055106, dated Jan. 22, 2020, 6 pages.
Taiwanese Office Action for Application No. 108136374, dated Jul. 1, 2020, 9 pages.
Billah et al. TCAD Simulation of Dual-Gate a-IGZO TFTs With Source and Drain Offsets, IEEE Electron Device Letters, vol. 37, No. 11, (Nov. 2016), pp. 1442-1445.
Liu et al., Highly Flexible Electronics from Scalable Vertical Thin Film Transistors, Nano Letters, vol. 14, (2014), pp. 1413-1418.
Petti et al., Flexible Quasi-Vertical In—Ga—Zn—O Thin-Film Transistor With 300-nm Channel Length, vol. 36, No. 5, (May 2015), pp. 475-477.
Yoon et al., Effects of Deposition Temperature on the Device Characteristics of Oxide Thin-Film Transistors Using In—Ga—Zn—O Active Channels Prepared by Atomic-Layer, Applied Materials &Interfaces, vol. 9, (2017), pp. 22676-22684.
Zheng et al., All-Sputtered, Flexible, Bottom-Gate IGZO/Al2O3 Bi-LayerThin Film Transistors on PEN Fabricated by a Fully Room Temperature Process, Journals of Materials Chemistry C, vol. 5, (2017), pp. 7043-7050.
Correia et al., A Second-Order S? ADC Using Sputtered IGZO TFTs, Chapter 2, Thin-Film Transistors, (2016), pp. 5-15.
Khakani et al., Reactive Pulsed Laser Deposition of Iridium Oxide Thin Films, Thin Solid Films, vol. 335, (1998), pp. 6-12.
Kushida-Abdelghafar et al., Post-Annealing Effects on Anitreduction Characteristics of IrO2/Pb(ZrxTi1-x)O3/Pt Ferroelectric Capacitors, Journal of Applied Physics, vol. 85, No. 2, (Jan. 15, 1999), pp. 1069-1074.
European Partial Supplementary Search Report for Application No. EP19870569, dated May 11, 2022, 12 pages.
European Extended Search Report and Opinion for European Application No. 19870569.1, dated Aug. 12, 2022, 10 pages.

* cited by examiner

TRANSISTORS INCLUDING HETEROGENEOUS CHANNELS

CROSS-REFERENCE TO RELATED APPLICATION

This application claims the benefit under 35 U.S.C. § 119(e) of U.S. Provisional Patent Application Ser. No. 62/743,075, filed Oct. 9, 2018, the disclosure of which is hereby incorporated herein in its entirety by this reference.

TECHNICAL FIELD

Embodiments of the disclosure relate to the field of semiconductor device design and fabrication. More specifically, embodiments of the disclosure relate to transistors including heterogeneous channels, and to related semiconductor devices, memory devices, electronic systems, and methods.

BACKGROUND

Semiconductor device designers often desire to increase the level of integration or density of features within a semiconductor device by reducing the dimensions of the individual features and by reducing the separation distance between neighboring features. In addition, semiconductor device designers often desire to design architectures that are not only compact, but offer performance advantages, as well as simplified designs.

One example of a semiconductor device is a memory device. Memory devices are generally provided as internal integrated circuits in computers or other electronic devices. There are many species of memory including, but not limited to, random-access memory (RAM), read-only memory (ROM), dynamic random access memory (DRAM), synchronous dynamic random access memory (SDRAM), ferroelectric random access memory (FeRAM), Flash memory, and resistance variable memory. Non-limiting examples of resistance variable memory include resistive random access memory (ReRAM), conductive bridge random access memory (conductive bridge RAM), magnetic random access memory (MRAM), phase change material (PCM) memory, phase change random access memory (PCRAM), spin-torque-transfer random access memory (STTRAM), oxygen vacancy-based memory, and programmable conductor memory.

A typical memory cell of a memory device includes a transistor and a memory storage structure (e.g., a capacitor). The transistor generally includes a channel region between a pair of source/drain regions, and a gate configured to electrically connect the source/drain regions to one another through the channel region. The transistors can comprise planar transistors or vertical transistors. Planar transistors can be distinguished from vertical transistors based upon the direction of current flow between the source and drain regions thereof. Current flow between the source and drain regions of a vertical transistor is primarily substantially orthogonal (e.g., perpendicular) to a primary (e.g., major) surface of a substrate or base structure thereunder, and current flow between source and drain regions of a planar transistor is primarily parallel to the primary surface of the substrate or base thereunder.

Many conventional transistors employ semiconductive materials such as silicon and polysilicon for the channels thereof. However, the use of such materials can result in some less desirable electrical properties in the transistor (e.g., high off current ($I_{off}$), low electron carrier mobility, scattering at an interface between a gate oxide material and the channel). In addition, the relatively small band gaps of such materials can hinder (or even preclude) improvements to other electrical properties (e.g., higher on current ($I_{on}$), faster switching speed, lower operating voltage, reduced current leakage) of the transistor. Other semiconductive materials, such as oxide semiconductor materials, have been investigated as alternatives for silicon and polysilicon for the channels of transistors. Such materials can have larger band gaps than silicon and polysilicon, and employing such materials can facilitate improved electrical properties (e.g., lower $I_{off}$) in the transistors. However, oxide semiconductor materials can be difficult to dope, which can, for example, negatively affect the flow of current through a channel formed thereof through Schottky barriers at junctions between the channel and metallic source/drain contacts.

A need, therefore, exists for new channel configurations for transistors (e.g., vertical transistors), and associated semiconductor devices (e.g., memory devices), electronic systems, and methods of forming semiconductor devices.

DETAILED DESCRIPTION

Figure 1A:
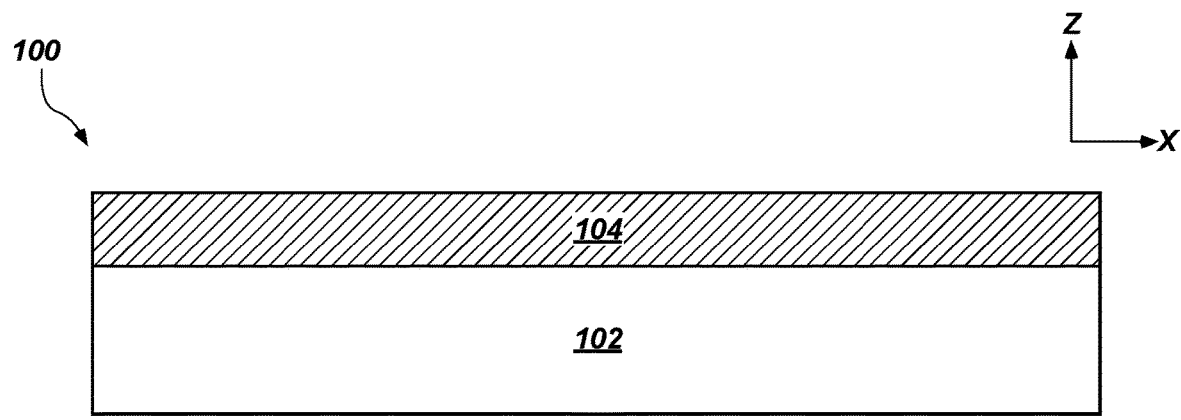
FIGS. 1A through 1F are simplified partial cross-sectional views illustrating embodiments of a method of forming a semiconductor device structure, in accordance with embodiments of the disclosure.

Transistors (e.g., access devices) including heterogeneous channels are described, as are related semiconductor devices, memory devices, electronic systems, and methods of forming semiconductor devices. In some embodiments, a transistor comprises a first conductive contact (e.g., a source contact), a heterogeneous channel comprising at least one oxide semiconductor material over the first conductive contact, a second conductive contact (e.g., a drain contact) over the heterogeneous channel, and a gate electrode laterally neighboring the heterogeneous channel. The heterogeneous channel may include a lower region over the first conductive contact, an upper region under the second conductive contact, and a middle region between the lower region and the upper region and having a larger band gap than at least one band gap of each of the lower region and the upper region. The middle region may, for example, include one or more of a higher atomic concentration of oxygen, a lower atomic concentration of metal elements, and a lower atomic concentration of metalloid elements relative to each of the lower region and the upper region. The heterogeneous channels and methods of the disclosure may facilitate the formation of devices (e.g., transistors, semiconductor devices, memory devices) and systems (e.g., electronic systems) having one or more of increased performance, increased efficiency, increased reliability, and increased durability as compared to conventional devices (e.g., conventional transistors, conventional semiconductor devices, conventional memory devices) and conventional systems (e.g., conventional electronic systems).

The following description provides specific details, such as material species, material thicknesses, and processing conditions in order to provide a thorough description of embodiments of the disclosure. However, a person of ordinary skill in the art will understand that the embodiments of the disclosure may be practiced without employing these specific details. Indeed, the embodiments of the disclosure may be practiced in conjunction with conventional fabrication techniques employed in the industry. In addition, the description provided below does not form a complete process flow for manufacturing a semiconductor device (e.g., a memory device). The semiconductor device structures described below do not form a complete semiconductor device. Only those process acts and structures necessary to understand the embodiments of the disclosure are described in detail below. Additional acts to form the complete semiconductor device from the semiconductor device structures may be performed by conventional fabrication techniques. Also note, any drawings accompanying the application are for illustrative purposes only, and are thus not drawn to scale. Additionally, elements common between figures may retain the same numerical designation.

As used herein, the term "substrate" means and includes a base material or construction upon which additional materials are formed. The substrate may be a semiconductor substrate, a base semiconductor layer on a supporting structure, a metal electrode, or a semiconductor substrate having one or more layers, structures or regions formed thereon. The substrate may be a conventional silicon substrate or other bulk substrate comprising a layer of semiconductive material. As used herein, the term "bulk substrate" means and includes not only silicon wafers, but also silicon-on-insulator (SOI) substrates, such as silicon-on-sapphire (SOS) substrates and silicon-on-glass (SOG) substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped. By way of non-limiting example, a substrate may comprise at least one of silicon, silicon dioxide, silicon with native oxide, silicon nitride, a carbon-containing silicon nitride, glass, semiconductor, metal oxide, metal, titanium nitride, carbon-containing titanium nitride, tantalum, tantalum nitride, carbon-containing tantalum nitride, niobium, niobium nitride, carbon-containing niobium nitride, molybdenum, molybdenum nitride, carbon-containing molybdenum nitride, tungsten, tungsten nitride, carbon-containing tungsten nitride, copper, cobalt, nickel, iron, aluminum, and a noble metal.

As used herein, the term "configured" refers to a size, shape, material composition, material distribution, orientation, and arrangement of one or more of at least one structure and at least one apparatus facilitating operation of one or more of the structure and the apparatus in a predetermined way.

As used herein, the singular forms "a," "an," and "the" are intended to include the plural forms as well, unless the context clearly indicates otherwise.

As used herein, "and/or" includes any and all combinations of one or more of the associated listed items.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, "vertically neighboring" or "longitudinally neighboring" features (e.g., structures, devices) means and includes features located most vertically proximate (e.g., vertically closest) one another. In addition, as used herein, "horizontally neighboring" or "laterally neighboring" features (e.g., structures, devices) means and includes features located most horizontally proximate (e.g., horizontally closest) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIGS. 1A through 1F, are simplified partial cross-sectional views illustrating embodiments of a method of forming a semiconductor device structure (e.g., a memory structure) for a semiconductor device (e.g., a memory device, such as a DRAM device, a FeRAM device, RRAM device, a conductive bridge RAM device, an MRAM device, a PCM device, a PCRAM device, an STTRAM device, an oxygen vacancy-based memory device, a programmable conductor memory device). With the description provided below, it will be readily apparent to one of ordinary skill in the art that the methods described herein may be used in various devices. In other words, the methods of the disclosure may be used whenever it is desired to form a semiconductor device structure.

Referring to FIG. 1A, a semiconductor device structure 100 may include a source line 102 (e.g., a common source line (CSL)), and a source contact 104 on or over the source line 102. The source line 102 may comprise at least one electrically conductive material, such as one or more of a metal, an alloy, a conductive metal oxide, a conductive metal nitride, a conductive metal silicide, and a conductively doped semiconductor material. By way of non-limiting example, the source line 102 may be formed of and include one or more of tungsten (W), tungsten nitride (WN), nickel (Ni), tantalum (Ta), tantalum nitride (TaN), tantalum silicide (TaSi), platinum (Pt), copper (Cu), silver (Ag), gold (Au), aluminum (Al), molybdenum (Mo), titanium (Ti), titanium nitride (TiN), titanium silicide (TiSi), titanium silicon nitride (TiSiN), titanium aluminum nitride (TiAlN), molybdenum nitride (MoN), iridium (Ir), iridium oxide ($IrO_x$), ruthenium (Ru), ruthenium oxide ($RuO_x$), and conductively doped silicon. In some embodiments, the source line 102 is formed of and includes W. The source line 102 may be positioned in, on, or over a substrate.

The source contact 104 may also comprise at least one electrically conductive material (e.g., one or more of a metal, an alloy, a conductive metal oxide, a conductive metal nitride, a conductive metal silicide, and a conductively doped semiconductor material). By way of non-limiting example, the source contact 104 may comprise one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. In some embodiments, the source contact 104 is formed of and includes TiN. The source contact 104 may be formed on or over the source line 102 to any desired thickness.

The source line 102 and the source contact 104 may be formed using conventional processes (e.g., conventional deposition processes) and conventional processing equipment, which are not described in detail herein. By way of non-limiting example, the source line 102 and the source contact 104 may be formed through one or more of in situ growth, spin-on coating, blanket coating, chemical vapor deposition (CVD), plasma enhanced chemical vapor deposition (PECVD), atomic layer deposition (ALD), and physical vapor deposition (PVD).

Figure 1B:
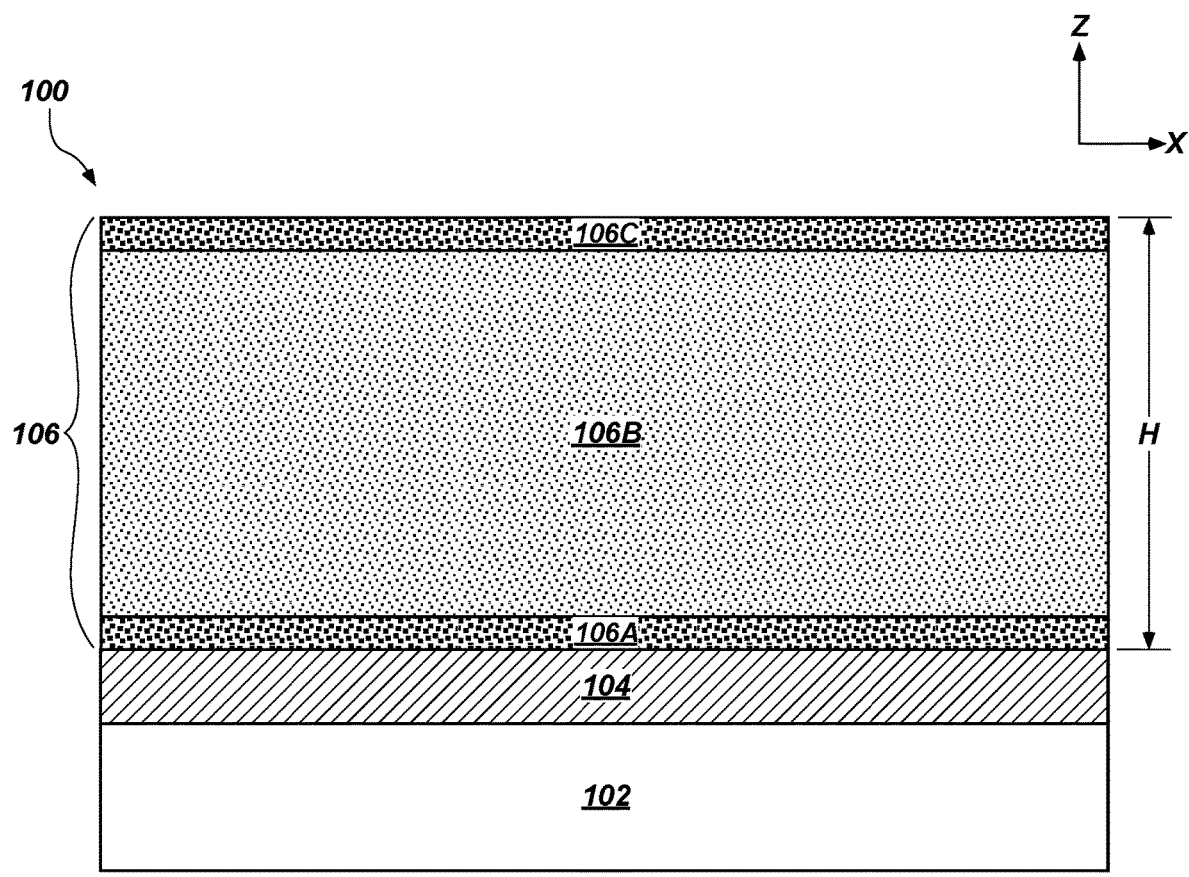

Referring next to FIG. 1B, a channel material 106 may be formed on or over the source contact 104. The channel material 106 is vertically heterogeneous, such that amounts (e.g., atomic concentrations) of one or more elements (e.g., oxygen, one or more metals, one or more metalloids) are non-uniform (e.g., vary, change) throughout different vertical regions (e.g., in the Z-direction) thereof. The heterogeneity of the channel material 106 may be substantially undetectable by visual inspection, but may be detectable by conventional spectroscopy or spectrometry techniques. As shown in FIG. 1B, in some embodiments, the channel material 106 includes a lower region 106A overlying the source contact 104, a middle region 106B overlying the lower region 106A, and an upper region 106C overlying the middle region 106B. As described in further detail below, a band gap of the channel material 106 within the middle region 106B may be different than (e.g., larger than) than band gap(s) of the channel material 106 within the lower region 106A and the upper region 106C.

The channel material 106 comprises a heterogeneous semiconductive material including at least one region (e.g., at least a middle region) having a band gap larger than that of polycrystalline silicon, such as a band gap larger than 1.65 electronvolts (eV). For example, the channel material 106 may comprise a heterogeneous oxide semiconductor material including one or more (e.g., one, two or more, three or more) of zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), indium oxide ($In_xO$), tin oxide ($Sn_xO$), titanium oxide ($Ti_xO$), zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials. Formulae including at least one of "x," "y," "z," and "a" above (e.g., $Zn_xSn_yO$, $In_xZn_yO$, $In_xGa_yZn_zO$, $In_xW_yO$, $In_xGa_ySi_zO$, $Al_xSn_yIn_zZn_aO$) represent a composite material that contains, throughout one or more regions thereof, an average ratio of "x" atoms of one element, "y" atoms of another element (if any), "z" atoms of an additional element (if any), and "d" atoms of a further element (if any) for every one atom of oxygen (O). As the formulae are representative of relative atomic ratios and not strict chemical structure, the channel material 106 may comprise one or more stoichiometric compounds and/or one or more non-stoichiometric compounds throughout the different regions (e.g., the lower region 106A, the middle region 106B, the upper region 106C) thereof, and values of "x," "y," "z," and "a" may be integers or may be non-integers throughout the different regions (e.g., the lower region 106A, the middle region 106B, the upper region 106C) thereof. As used herein, the term "non-stoichiometric compound" means and includes a chemical compound with an elemental composition that cannot be represented by a ratio of well-defined natural numbers and is in violation of the law of definite proportions.

With continued reference to FIG. 1B, amounts (e.g., atomic concentrations) of one or more elements in the lower region 106A of the channel material 106 and the upper region 106C of the channel material 106 may be controlled relative to amounts of the one or more elements in the middle region 106B of the channel material 106 to permit the lower region 106A and the upper region 106C to each individually have at least one band gap smaller than a band gap of the middle region 106B. By way of non-limiting example, the lower region 106A and the upper region 106C may each individually have increased atomic concentration(s) of one or more metals (e.g., In, Sn, Zn, Ga, Mg, Ti, Al, Zr) and/or metalloids (e.g., Si) and a decreased atomic concentration of oxygen relative to the middle region 106B. Put another way, the lower region 106A and the upper region 106C may each individually be metal-rich and oxygen-lean relative to the middle region 106B. In some embodiments, such as embodiments wherein the channel material 106 comprises a heterogeneous form of an In-containing oxide semiconductor material (e.g., $In_xZn_yO$, $In_xGa_yZn_zO$, $In_xGa_ySi_zO_a$, $In_xW_yO$, $In_xO$, $In_xZn_yO$, $Zr_x In_yZn_zO$, $Hf_xIn_yZn_zO$, $Sn_xIn_yZn_zO$, $Al_xSn_yIn_zZn_aO$, $In_xGa_y Si_zO$), the lower region 106A and the upper region 106C each individually comprise increased atomic concentrations of In and decreased atomic concentrations of oxygen as compared to the middle region 106B. In additional embodiments, the channel material 106 comprises $In_xGa_yZn_zO$, and the lower region 106A and the upper region 106C each comprise $In_xO$ (e.g., indium (III) oxide, $In_2O_3$).

In some embodiments, the channel material 106 includes substantially the same elements in each of the different vertical regions thereof, but at least the middle region 106B of the channel material 106 includes a different atomic concentration of one or more of the elements than the lower region 106A and the upper region 106C. The channel material 106 may, for example, comprise a heterogeneous form of a single (e.g., only one) oxide semiconductor material (e.g., only one of $Zn_xSn_yO$, $In_xZn_yO$, $Zn_xO$, $In_x Ga_yZn_zO$, $In_xGa_ySi_zO_a$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_y In_zZn_aO$, $Si_xIn_yZn_zO$, $Zn_xSn_yO$, $Al_xZn_ySn_zO$, $Ga_xZn_ySn_zO$, $Zr_xZn_ySn_zO$, and $In_xGa_ySi_zO$), but atomic concentrations of one or more elements of the single oxide semiconductor material (and, hence, the relative atomic ratios of the formula thereof) may be different in middle region 106B than in the lower region 106A and the upper region 106C. By way of non-limiting example, the channel material 106 may comprise a heterogeneous form of $In_xGa_yZn_zO$, such that each of the lower region 106A, the middle region 106B, and the upper region 106C of the channel material 106 include In, Ga, Zn, and O, but atomic concentration(s) of one or more of In, Ga, Zn, and O (e.g., In and/or O) in the middle region 106B is/are different than atomic concentration(s) of the one or more of In, Ga, Zn, and O (e.g., In and/or O) in the lower region 106A and the upper region 106C. Accordingly, values of one or more of "x," "y," and "z" for the formula "$In_xGa_yZn_zO$" may be different for the middle region 106B of the channel material 106 than for lower region 106A of the channel material 106 and the upper region 106C of the channel material 106.

In additional embodiments, the channel material 106 includes different elements in at least one of the different vertical regions thereof than in at least one other of the different vertical regions thereof. The channel material 106 may, for example, comprise a stack (e.g., laminate) of two or more (e.g., two, three, more than three) different oxide semiconductor materials (e.g., two or more of $Zn_xSn_yO$, $In_xZn_yO$, $Zn_xO$, $In_xGa_yZn_zO$, $In_xGa_ySi_zO_a$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, $Zr_xZn_ySn_zO$, and $In_xGa_ySi_zO$). As a non-limiting example, the middle region 106B of the channel material 106 may be formed of and include a different oxide semiconductor material than at least one (e.g., each) of the lower region 106A of the channel material 106 and the upper region 106C of the channel material 106. Accordingly, the middle region 106B may include or may be substantially free of at least one element (e.g., metal, metalloid) included in one or more (e.g., each) of the lower region 106A and the upper region 106C. As another non-limiting example, each of the lower region 106A, the middle region 106B, and the upper region 106C of the channel material 106 may be formed of and include a different oxide semiconductor material than each other of the lower region 106A, the middle region 106B, and the upper region 106C.

In some embodiments, the different vertical regions of the channel material 106 each individually exhibit a substantially homogeneous distribution of the elements thereof, such that the elements of the vertical region are substantially uniformly distributed throughout the vertical region. For example, the lower region 106A, the middle region 106B, and the upper region 106C of the channel material 106 may each individually exhibit a substantially homogeneous distribution of the elements thereof. In additional embodiments, at least one of the different vertical regions of the channel material 106 exhibits a heterogeneous distribution of one or more of the elements thereof, such that the one or more elements of the vertical region are non-uniformly distributed throughout the vertical region. For example, one or more (e.g., each) of the lower region 106A and the upper region 106C of the channel material 106 may exhibit a heterogeneous distribution of one or more elements thereof. In such embodiments, amounts of one or more elements (e.g., one or more metals, one or more metalloids, oxygen) may vary throughout the thickness (e.g., height) of the lower region 106A and/or the upper region 106C. As a non-limiting example, amounts of at least one metal and/or at least one metalloid in one or more (e.g., each) of the lower region 106A and the upper region 106C may increase in a direction (e.g., the positive Z-direction, the negative Z-direction) extending away from the middle region 106B of the channel material 106. As another non-limiting example, amounts of oxygen in one or more (e.g., each) of the lower region 106A and the upper region 106C may decrease in a direction (e.g., the positive Z-direction, the negative Z-direction) extending away from the middle region 106B of the channel material 106. If a vertical region (e.g., the lower region 106A, the middle region 106B, the upper region 106C) of the channel material 106 exhibits a heterogeneous distribution of one or more of the elements thereof, amounts of the one or more elements may vary stepwise (e.g., change abruptly), or may vary continuously (e.g., change progressively, such as linearly or parabolically) throughout the thickness of the vertical region.

The channel material 106 may have a height H (e.g., thickness) within a range of from about 30 nanometers (nm) to about 200 nm, such as from about 50 nm to about 200 nm, from about 75 nm to about 200 nm, from about 100 nm to about 200 nm, or from about 150 nm to about 200 nm. In some embodiments, the height H of the channel material 106 is within a range of from about 50 nm to about 100 nm. The lower region 106A and the upper region 106C may each individually constitute from about 1 percent to about 20 percent (e.g., from about 5 percent to about 10 percent) of the height H of the channel material 106, and the middle region 106B may constitute a remainder (e.g., from about 60 percent to about 98 percent, such as from about 80 percent to about 90 percent) of the height H of the channel material 106.

The lower region 106A and the upper region 106C of the channel material 106 may be substantially similar to one another (e.g., may exhibit substantially the same height, material composition, and material distribution extending away from the middle region 106B), or may be at least partially different than one another (e.g., may exhibit one or more of different height, different material compositions, and different material distributions extending away from the middle region 106B). Accordingly, the lower region 106A and the upper region 106C may have substantially the same band gap(s) as one another, or may have different band gaps than one another. In some embodiments, the lower region 106A and the upper region 106C of the channel material 106 are substantially similar to one another, and, hence, have substantially similar band gap(s) smaller than a band gap of the middle region 106B of the channel material 106. In additional embodiments, the lower region 106A and the upper region 106C of the channel material 106 are at least partially different than one another. In such embodiments, the lower region 106A and the upper region 106C may have different band gap(s) than one another, but respectively still smaller than a band gap of the middle region 106B of the channel material 106; or may have substantially similar band gap(s), but one or more different properties (e.g., different heights, different material compositions, and/or different material distributions extending away from the middle region 106B) than one another.

As described in further detail below, the channel material 106, including the different vertical regions thereof (e.g., the lower region 106A, the middle region 106B, the upper region 106C), may be formed through various processes. Suitable processes include, but are not limited to, CVD, PECVD, ALD, and PVD (including sputtering, evaporation, and/or ionized PVD), so long as the process employed permits the adjustment of one or more parameters (e.g., materials, material flow rates) facilitating the formation of the different vertical regions of the channel material 106. The process (or processes) employed to form the different vertical regions of the channel material 106 may at least partially depend on the desired properties (e.g., material compositions, material distributions, dimensions) of the different vertical regions of the channel material 106.

In some embodiments, the channel material 106 is formed, at least in part, through a PVD process that includes manipulating (e.g., modifying, varying, changing, adjusting) a flow of oxygen ($O_2$) gas and/or one or more target (e.g., source) plasma bombardment parameters (e.g., employed power, selected targets, target material compositions, quantities of targets) during deposition of the different vertical regions (e.g., the lower region 106A, the middle region 106B, the upper region 106C) of the channel material 106. For example, the semiconductor device structure 100 (at the processing stage depicted in FIG. 1A) and one or more targets (e.g., oxide semiconductor targets, metal targets, metalloid targets) comprising components (e.g., elements) for inclusion in the channel material 106 may be provided into a deposition chamber (a PVD chamber) configured to receive $O_2$ gas and to generate a plasma including a noble gas element (e.g., helium, neon, argon, krypton, xenon, radon). Thereafter, the plasma may be generated, and one or more of the targets are bombarded therewith. As the target(s) are bombarded with the plasma, atoms of the target(s) are sputtered from surfaces thereof and may be deposited over an upper surface of the source contact 104. Oxygen atoms from the $O_2$ gas may also covalently bond to the atoms sputtered over the upper surface of the source contact 104. The different vertical regions of the channel material 106 may be formed by adjusting the one or more of the $O_2$ gas flow rate, the power employed for the plasma, and target selection (e.g., target material species, target quantities) for bombardment by the plasma. By way of non-limiting example, to form the lower region 106A and the upper region 106C of the channel material 106, the $O_2$ gas flow rate may be decreased (relative to that employed to form the middle region 106B of the channel material 106), the power employed for the plasma may be increased, and/or relatively metal-enriched (and/or metalloid-enriched) targets (as compared to those employed to form the middle region 106B) may be selected for plasma bombardment, such that the lower region 106A and the upper region 106C are formed to be metal-rich (and/or metalloid-rich) and/or oxygen-lean as compared to the middle region 106B. If a heterogeneous distribution of one or more elements (e.g., oxygen, one or more metals, one or more metalloids) is desired in one or more of the different vertical regions (e.g., the lower region 106A and the upper region 106C), one or more of the $O_2$ gas flow rate, the power employed for the plasma, and the targets selected for plasma bombardment may be adjusted during the formation of the vertical region. In some embodiments, one or more of the $O_2$ gas flow rate, the power employed for the plasma, and the targets selected for plasma bombardment are varied during the formation of the lower region 106A and the upper region 106C such that the lower region 106A and the upper region 106C each go from oxygen-rich and metal-lean to oxygen-lean and metal-rich in a direction extending away from the middle region 106B.

In additional embodiments, the channel material 106 is formed, at least in part, through one or more of an ALD process and a CVD process that includes manipulating (e.g., modifying, varying, changing, adjusting) flow rates of one or more precursors and/or one or more reactants, and/or modifying one or more deposition cycle parameters (e.g., precursors, reactants, pulse times) during deposition of the different vertical regions (e.g., the lower region 106A, the middle region 106B, the upper region 106C) of the channel material 106. For example, the semiconductor device structure 100 (at the processing stage depicted in FIG. 1A) may be provided into a deposition chamber (an ALD chamber, a CVD chamber) configured to receive alternating pulses of at least one precursor and at least one reactant with intervening pulses of at least one inert gas (e.g., nitrogen, argon, helium, neon, krypton, xenon, and/or other gases that, although not inert, behave as inert under the conditions of the dielectric formation process). The precursor may comprise a complex of at least one metal species (and/or at least one metalloid species) for inclusion in at least one of the vertical regions of the channel material 106 and at least one ligand (e.g., a ligand comprising one or more of hydrogen, nitrogen, and carbon) formulated to react with (and be eliminated by) the reactant to form at least a portion of the at least one vertical region. The reactant may comprise a material reactive with the ligand of the precursor to form the at least a portion of the at least one vertical region of the channel material 106, such as at least one oxidizing agent (e.g., oxygen, ozone, water, hydrogen peroxide, nitrous oxide). The different vertical regions of the channel material 106 may be formed by adjusting one or more of the precursor species, precursor species amounts, precursor pulse times, reactant species, reactant species amounts, reactant pulse times, inert species, and inert species pulse times during the deposition process. By way of non-limiting example, to form the lower region 106A and the upper region 106C of the channel material 106, one or more relatively metal-enriched (and/or metalloid-enriched) species (as compared to those employed to form the middle region 106B) and/or one or more relatively oxygen-lean reactive species may be employed during pulse cycles associated with the lower region 106A and the upper region 106C, so that the lower region 106A and the upper region 106C are formed to be metal-rich (and/or metalloid-rich) and/or oxygen-lean as compared to the middle region 106B. If a heterogeneous distribution of one or more elements (e.g., oxygen, one or more metals, one or more metalloids) is desired in one or more of the different vertical regions (e.g., the lower region 106A and the upper region 106C), one or more of the precursor species, precursor species amounts, precursor pulse times, reactant species, reactant species amounts, reactant pulse times, inert species, and inert species pulse times may be adjusted during the formation of the vertical region. In some embodiments, one or more of the precursor species, precursor species amounts, precursor pulse times, reactant species, reactant species amounts, reactant pulse times, inert species, and inert species pulse times are varied during the formation of the lower region 106A and the upper region 106C such that the lower region 106A and the upper region 106C each go from oxygen-rich and metal-lean to oxygen-lean and metal-rich in a direction extending away from the middle region 106B.

In further embodiments, the channel material 106 is formed, at least in part, using one or more deposition processes (e.g., one or more PVD processes, one or more ALD processes, one or more CVD processes, combinations thereof) in combination with one or more subsequent treatment processes (e.g., one or more subsequent ion-implantation processes, one or more subsequent plasma treatment processes). By way of non-limiting example, following formation, one or more of the lower region 106A and the upper region 106C of the channel material 106 may be doped (e.g., by way of at least one of an ion implantation process and a plasma treatment process) with at least one element selected from the group consisting of hydrogen (e.g., protium, deuterium), nitrogen, other non-metal elements (e.g., phosphorus), and metalloid elements (e.g., boron, arsenic, tellurium). The at least one element and conditions (e.g., temperature, pressure, power, duration, etc.) for doping the lower region 106A and/or the upper region 106C may be selected at least partially based on a desired depth of penetration into the lower region 106A and/or the upper region 106C. The at least one element may alter the charge carrier (e.g., hole, electron) characteristics of the lower region 106A and/or the upper region 106C, and/or may passivate at least some dangling bonds within the lower region 106A and/or the upper region 106C.

Figure 1C:
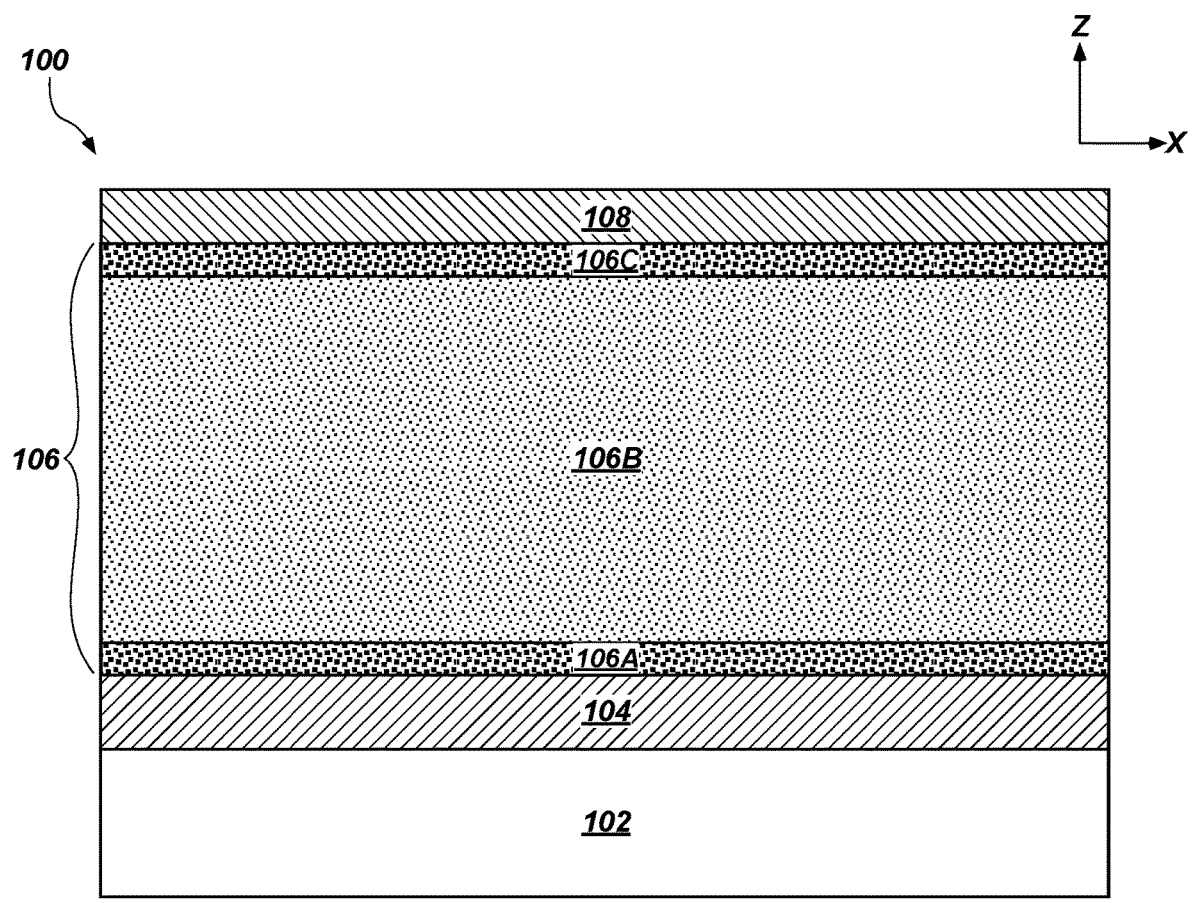

Next, referring to FIG. 1C, a gate drain contact material 108 may be formed on or over the channel material 106 (e.g., on or over the upper region 106C of the channel material 106). The drain contact material 108 may be formed of and include at least one electrically conductive material, such as one or more of a metal, a metal alloy, a conductive metal oxide, a conductive metal nitride, a conductive metal silicide, and a conductively doped semiconductor material. The drain contact material 108 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, $IrO_x$, Ru, $RuO_x$, and conductively doped silicon. The material composition of the drain contact material 108 may be the same as or may be different than the material composition of the source contact 104. In at least some embodiments, the drain contact material 108 is formed of and includes Ti. In addition, the drain contact material 108 may be formed on or over the channel material 106 to any desired thickness. The drain contact material 108 may exhibit substantially the same thickness as the source contact 104, or may exhibit a different thickness than the source contact 104. The drain contact material 108 may be formed using conventional processes (e.g., conventional deposition processes, such as at least one of in situ growth, spin-on coating, blanket coating, CVD, PECVD, ALD, and PVD) and conventional processing equipment, which are not described in detail herein.

Figure 1D:
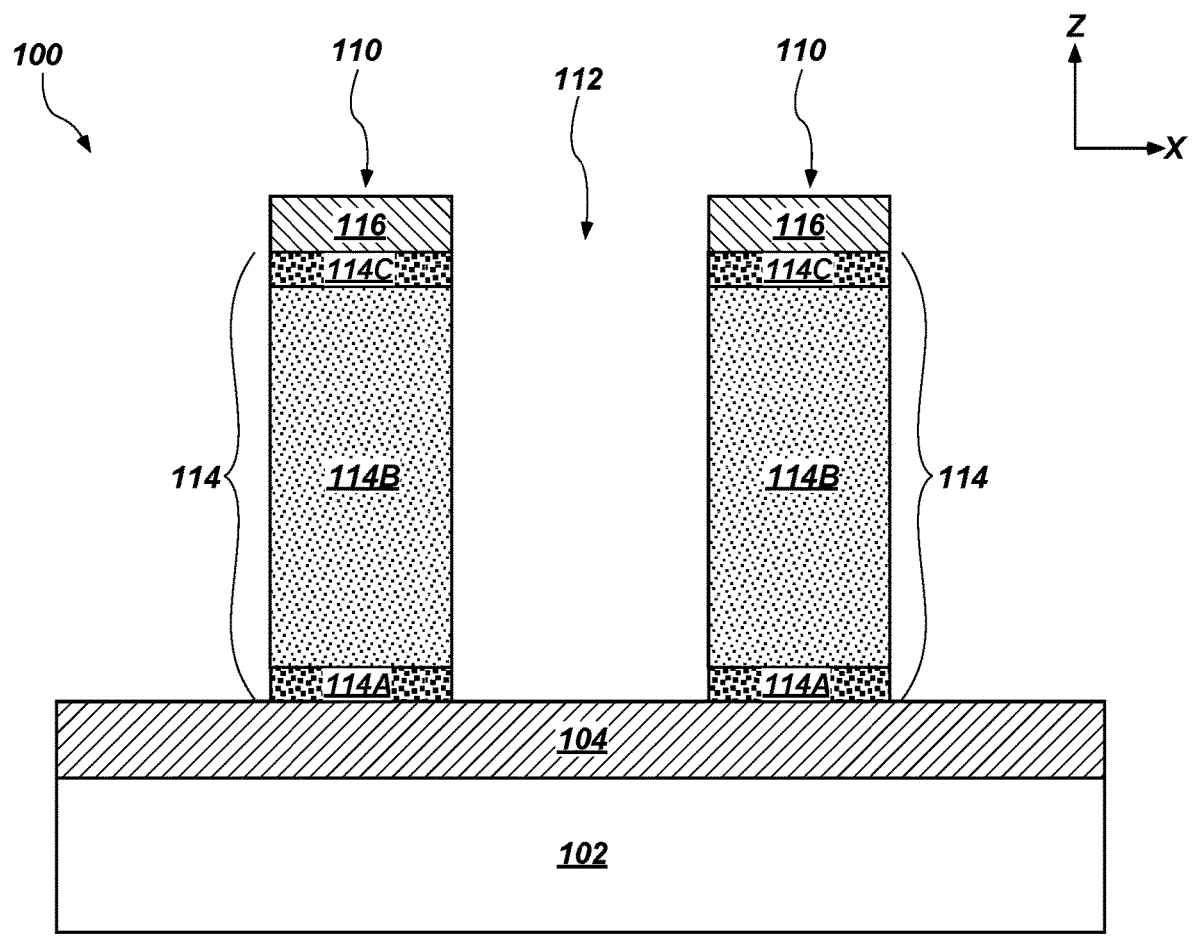

Referring next to FIG. 1D, portions of the drain contact material 108 (FIG. 1C) and the channel material 106 (FIG. 1C) may be removed to form pillar structures 110 overlying the source contact 104. Each of the pillar structures 110 may include a drain contact 116 (corresponding to a remaining portion of the drain contact material 108) and a heterogeneous channel 114 (corresponding to a remaining portion of the drain contact material 108). As shown in FIG. 1D, the heterogeneous channel 114 of each of the pillar structures 110 may be vertically heterogeneous, including a lower region 114A, a middle region 114B, and an upper region 114C respectively corresponding to remaining portions of the lower region 106A (FIG. 1C), the middle region 106B (FIG. 1C), and the upper region 106C (FIG. 1C) of the channel material 106 (FIG. 1C). The source contact 104 may be shared by the pillar structures 110. In addition, laterally neighboring pillar structures 110 may be separated (e.g., spaced apart, distanced) from one another by openings 112 vertically extending (e.g., in the Z-direction) from upper surfaces of the drain contacts 116 to an upper surface of the source contact 104.

At least one material removal process may be used to form the pillar structures 110 and the openings 112. By way of non-limiting example, the drain contact material 108 (FIG. 1C) and the channel material 106 (FIG. 1C) may be exposed to at least one etching process (e.g., at least one dry etching process, such as at least one of a reactive ion etching (RIE) process, a deep RIE process, a plasma etching process, a reactive ion beam etching process, and a chemically assisted ion beam etching process; at least one wet etching process, such as at least one of a wet chemical etching process, a buffered hydrofluoric acid etching process, and a buffered oxide etching process) to form the pillar structures 110 and the openings 112.

Figure 1E:
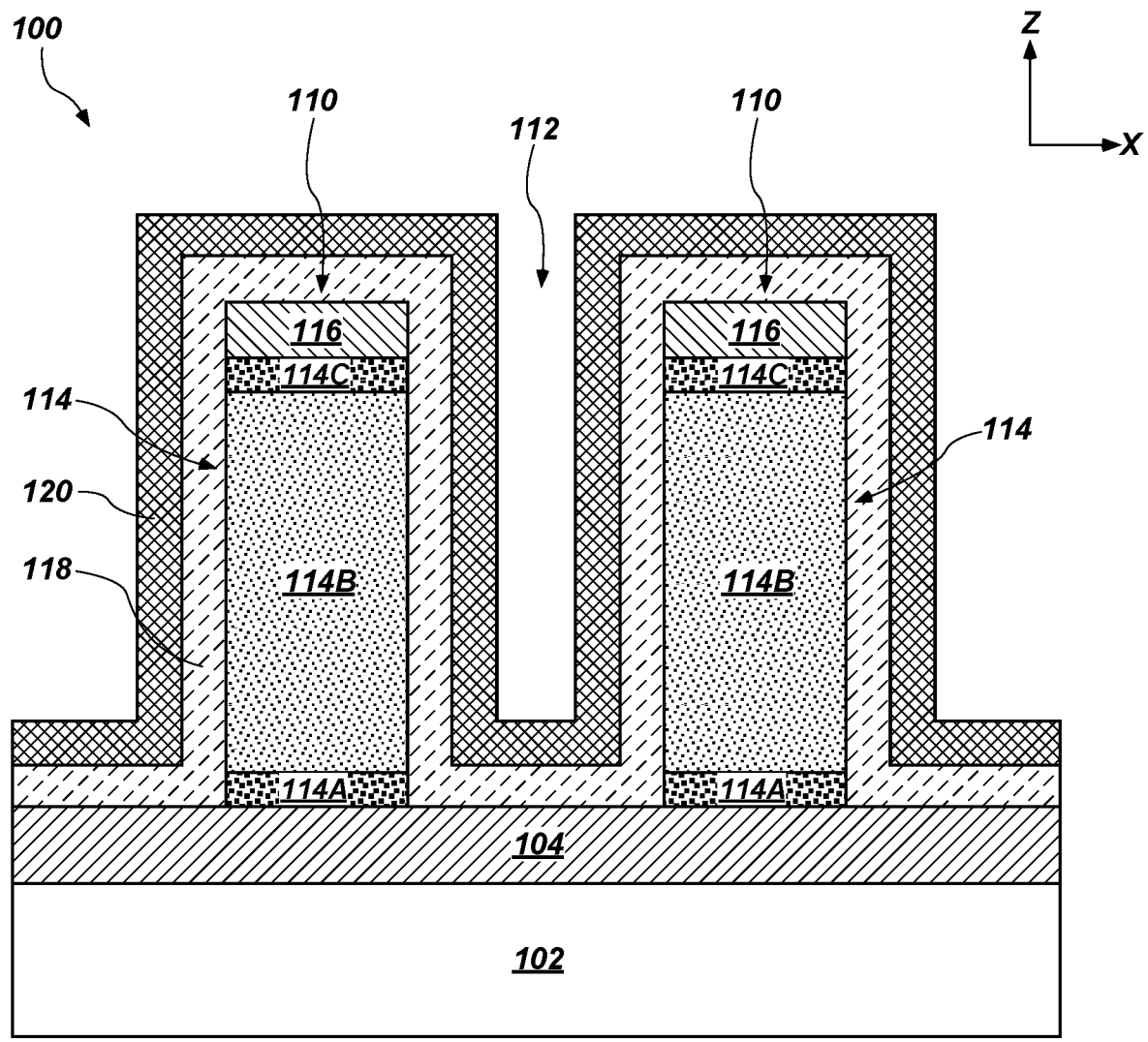

Next, referring to FIG. 1E, a gate dielectric material 118 may be formed (e.g., conformally formed) on or over exposed surfaces of the pillar structures 110 and the source contact 104, and a gate material 120 may be formed (e.g., conformally formed) on or over exposed surfaces of the gate dielectric material 118.

The gate dielectric material 118 may be formed of and include a dielectric oxide material (e.g., silicon dioxide; phosphosilicate glass; borosilicate glass; borophosphosilicate glass; fluorosilicate glass; aluminum oxide; high-k oxides, such as hafnium oxide ($HfO_x$); a combination thereof), a dielectric nitride material (e.g., silicon nitride (SiN)), a dielectric oxynitride material (e.g., silicon oxynitride (SiON)), a dielectric carbonitride material (e.g., silicon carbonitride (SiCN)), and a dielectric carboxynitride material (e.g., silicon carboxynitride (SiOCN)), and amphorous carbon. In some embodiments, the gate dielectric material 118 comprises silicon dioxide. The gate dielectric material 118 may be formed at any suitable thickness. The thickness of the gate dielectric material 118 may be selected (e.g., tailored) to provide a desired lateral offset (e.g., space, distance) between the pillar structures 110 and gate electrodes to be subsequently formed laterally adjacent thereto, and to provide a desired longitudinal offset (e.g., space, distance) between the subsequently-formed gate electrodes and the source contact 104. By way of non-limiting example, the thickness of the gate dielectric material 118 may be less than or equal to about 20 nm, less than or equal to about 10 nm, or less than or equal to about 5 nm. In some embodiments, the thickness of the gate dielectric material 118 is within a range of from about 5 nm to about 10 nm. The thickness of the gate dielectric material 118 may be substantially uniform, or at least one region of the gate dielectric material 118 may have a different thickness than at least one other region of the gate dielectric material 118.

The gate material 120 may be formed of and include at least one electrically conductive material, such as one or more of a metal, a metal alloy, a conductive metal oxide, a conductive metal nitride, a conductive metal silicide, and a conductively doped semiconductor material. The gate material 120 may, for example, be formed of and include one or more of W, WN, Ni, Ta, TaN, TaSi, Pt, Cu, Ag, Au, Al, Mo, Ti, TiN, TiSi, TiSiN, TiAlN, MoN, Ir, IrO$_x$, Ru, RuO$_x$, and conductively doped silicon. The material composition of the gate material 120 may be the same as or may be different than the material composition of one or more of the source line 102, the source contact 104, and the drain contacts 116. In at least some embodiments, the gate material 120 is formed of and includes TiN. In addition, the gate material 120 may be formed at any suitable thickness. By way of non-limiting example, the thickness of the gate material 120 may be within a range of from about 5 nm to about 15 nm, such as from about 5 nm to about 10 nm, or from about 10 nm to about 15 nm. In some embodiments, the thickness of the gate material 120 is within a range of from about 5 nm to about 10 nm.

The gate dielectric material 118 and the gate material 120 may each individually be formed using conventional processes (e.g., one or more of spin-on coating, CVD, PECVD, ALD, and PVD) and conventional processing equipment, which are not described in detail herein.

Figure 1F:
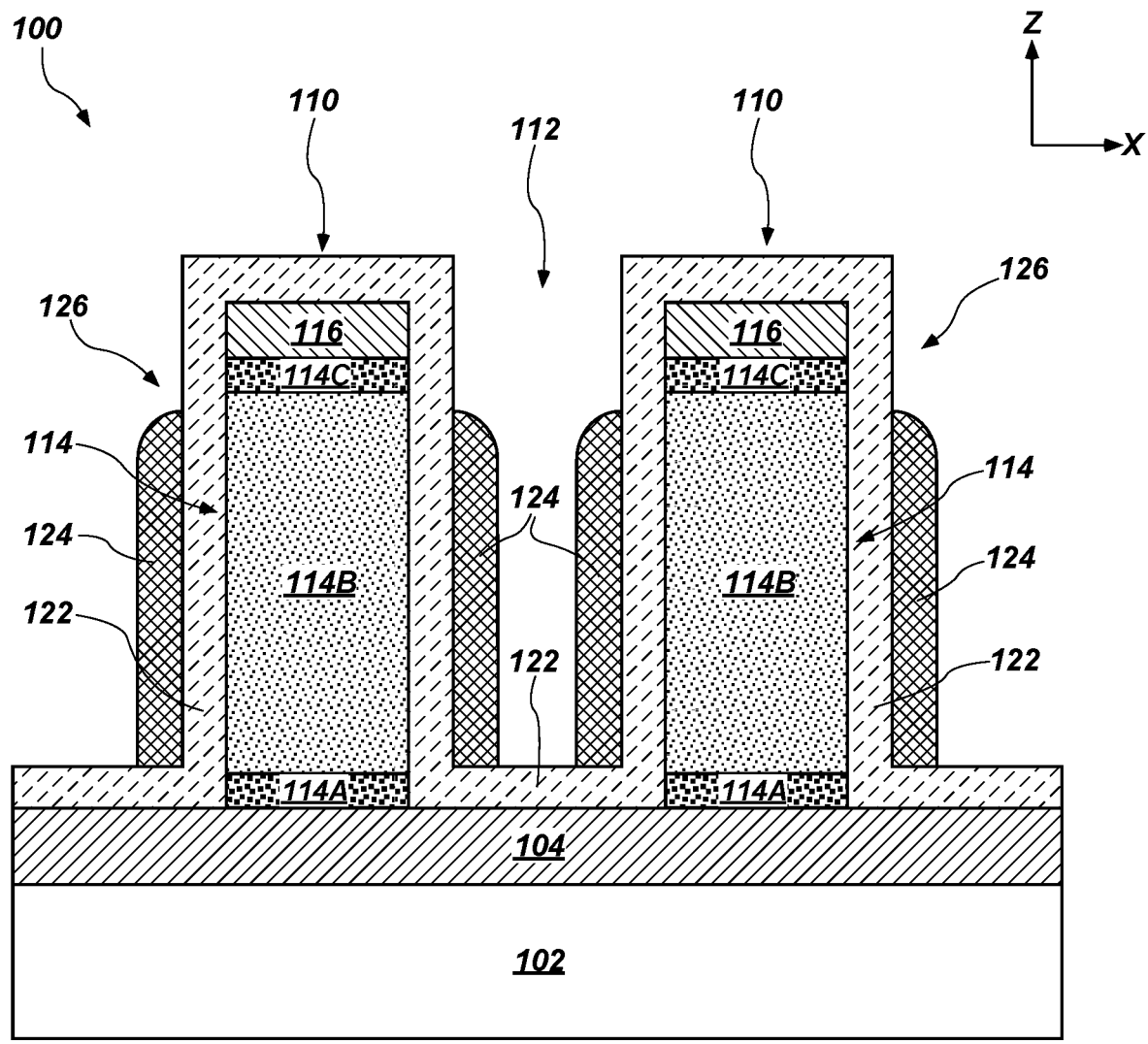

Referring to next to FIG. 1F, portions of the gate material 120 (FIG. 1E) and the gate dielectric material 118 (FIG. 1E) may be removed to form gate electrodes 124 and gate dielectric liner structures 122. The gate electrodes 124 laterally flank opposing sidewalls of each of the pillar structures 110. For example, each of the pillar structures 110 may exhibit a first of the gate electrodes 124 laterally neighboring a first sidewall thereof, and may further exhibit a second of the gate electrodes 124 laterally neighboring a second sidewall thereof opposite the first sidewall. The gate electrodes 124 may laterally-neighbor the middle regions 114B of the heterogeneous channels 114 of the pillar structures 110. In addition, the gate electrodes 124 may be substantially positioned (e.g., substantially confined) within vertical boundaries of the middle regions 114B of the heterogeneous channels 114 of the pillar structures 110. Put another way, the gate electrodes 124 may be substantially vertically positioned between the lower regions 114A and the upper regions 114C of the heterogeneous channels 114 of the pillar structures 110. Furthermore, as shown in FIG. 1F, the gate dielectric liner structures 122 may laterally intervene between the pillar structures 110 and the gate electrodes 124, and may vertically intervene between the gate electrodes 124 and the source contact 104.

The gate electrodes 124 and the gate dielectric liner structures 122 may each individually be formed using conventional material removal processes (e.g., conventional etching processes) and conventional material removal equipment, which are not described in detail herein. For example, to form the gate electrodes 124, the gate material 120 (FIG. 1E) may be subjected to a conventional anisotropic etching process (e.g., a conventional anisotropic dry etching process) to remove portions of the gate material 120 (FIG. 1E) neighboring (e.g., vertically neighboring, laterally neighboring) the upper regions 114C of the heterogeneous channels 114 of the pillar structures 110 and additional portions of the gate material 120 (FIG. 1E) vertically neighboring portions of the source contact 104 underlying the openings 112, while maintaining other portions of the gate material 120 (FIG. 1E) laterally neighboring the middle regions 114B of the heterogeneous channels 114 of the pillar structures 110. In addition, to form the gate dielectric liner structures 122, the gate dielectric material 118 (FIG. 1E) may be subjected to at least one chemical mechanical planarization (CMP) process to remove portions of the gate dielectric material 118 (FIG. 1E) positioned outside of the boundaries (e.g., vertical boundaries, lateral boundaries) of the openings 112 (e.g., portions of the gate dielectric material 118 vertically neighboring the upper regions 114C of the heterogeneous channels 114 of the pillar structures 110).

The semiconductor device structure 100 at the processing stage depicted in FIG. 1F (e.g., following the formation of the gate electrodes 124 and the gate dielectric liner structures 122) includes multiple vertical transistors 126 (e.g., vertical thin film transistors (TFTs)). Each vertical transistor 126 includes one (1) of the pillar structures 110 (including the drain contact 116 and the heterogeneous channel 114 thereof), the source contact 104 (which is shared between at least some of the vertical transistors 126), two (2) of the gate electrodes 124 laterally flanking the one (1) of the pillar structures 110, and portions of the gate dielectric liner structures 122 intervening between the one (1) of the pillar structures 110 and each of the two (2) of the gate electrodes 124. Each vertical transistor 126 may be considered to be "double-gated" since two (2) of the gate electrodes 124 laterally-neighbor two (2) opposing sides of the heterogeneous channel 114 (e.g., of the middle region 114B of the heterogeneous channel 114) of the vertical transistor 126. For each vertical transistor 126, the configuration of the heterogeneous channel 114 (including the configurations of the lower region 114A, the middle region 114B, and the upper region 114C) thereof may diminish (or even eliminate) Schottky barriers (e.g., electrostatic depletion layers) and promote Ohmic contact at junctions between the heterogeneous channel 114 and each of the source contact 104 and the drain contact 116 of the vertical transistor 126. Accordingly, the vertical transistors 126 (and, hence, the semiconductor device structure 100, and devices and systems including the vertical transistors 126) may exhibit improved performance over conventional vertical transistors not including the heterogeneous channel 114 of the disclosure.

Thus, a transistor according to embodiments of the disclosure comprises a first conductive contact, a heterogeneous channel comprising at least one oxide semiconductor material over the first conductive contact, a second conductive contact over the heterogeneous channel, and a gate electrode laterally neighboring the heterogeneous channel.

Furthermore, a device according to embodiments of the disclosure comprises a conductive line, a conductive contact on the conductive line, pillar structures on the conductive contact, gate electrodes laterally neighboring the pillar structures, and dielectric material intervening between the gate electrodes and the pillar structures. Each pillar structure comprises an oxide semiconductor channel comprising a region and at least one additional region, the region having one or more of a different material composition and a different atomic concentration of one or more elements than the at least one additional region; and another conductive contact on the oxide semiconductor channel.

Moreover, in accordance with embodiments of the disclosure, a method of forming a device comprises forming a heterogeneous channel material on a conductive structure, the heterogeneous channel material comprising at least one oxide semiconductor material. A conductive material is formed on the heterogeneous channel material. Portions of the conductive material and the heterogeneous channel material are removed to form pillar structures laterally separated from one another by openings. Electrode structures and dielectric liner structures are formed in the openings.

Figure 2:
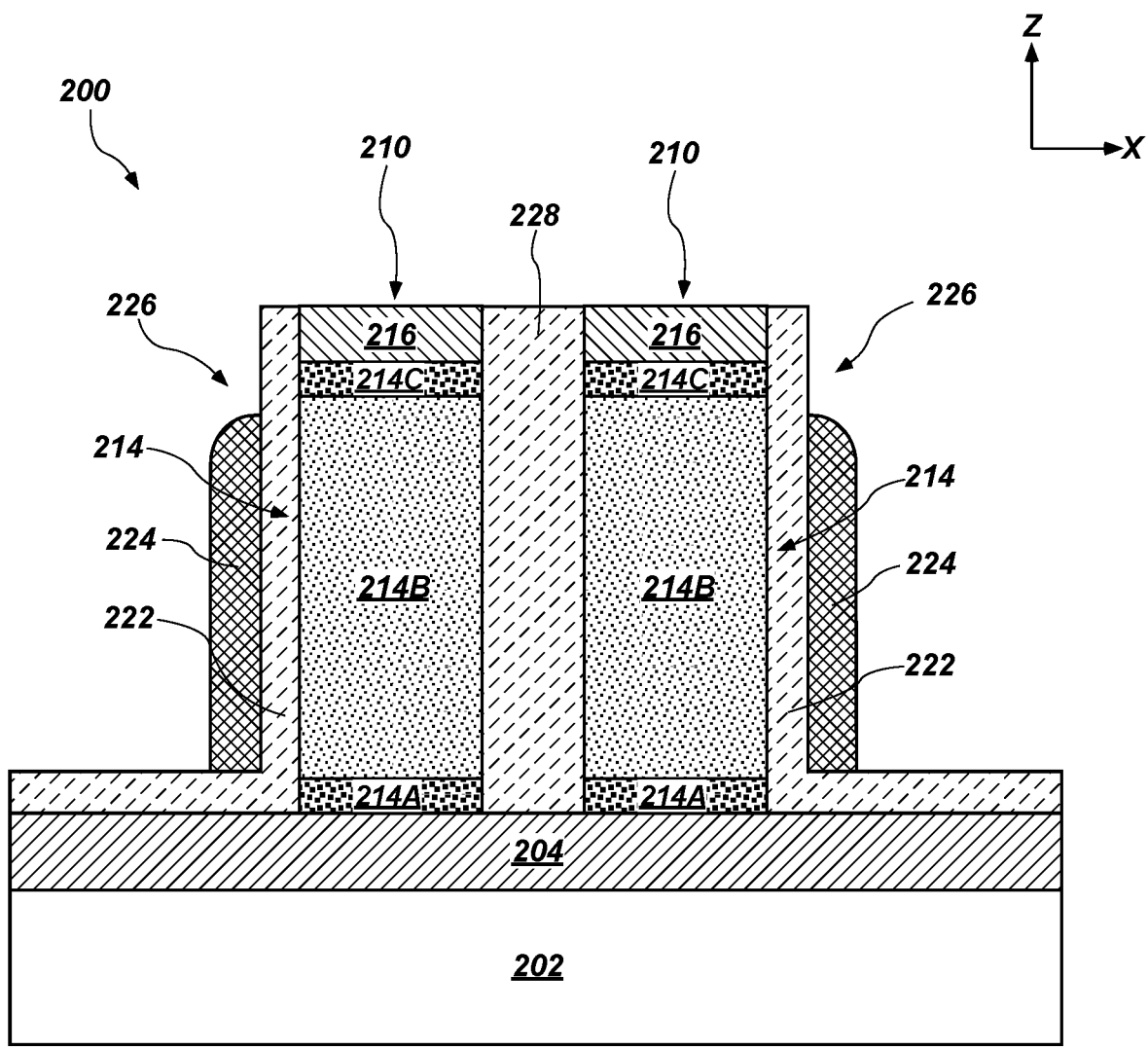
FIG. 2 is a simplified partial cross-sectional view of another semiconductor device structure, in accordance with additional embodiments of the disclosure.
Figure 3A:
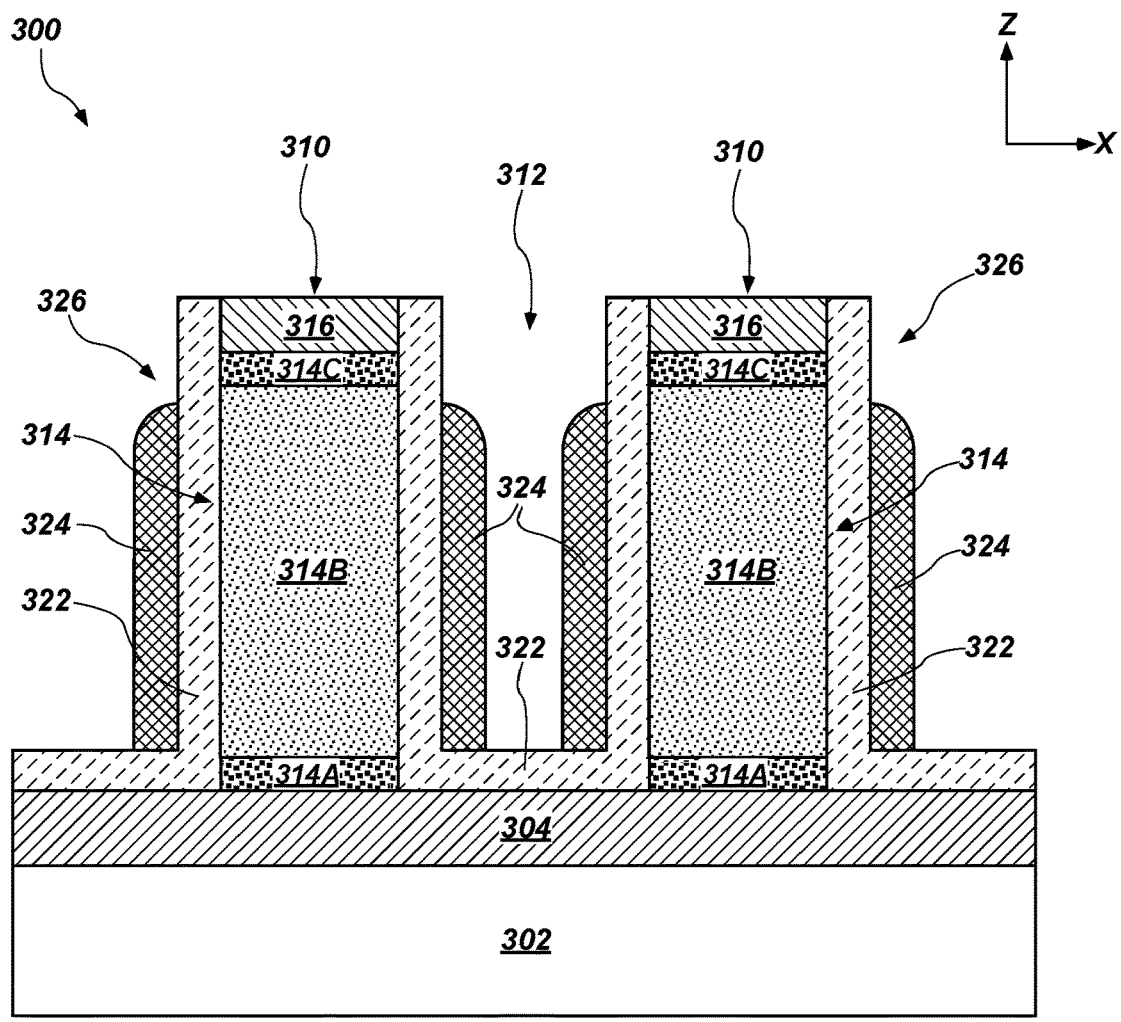
FIGS. 3A and 3B are simplified partial cross-sectional (FIG. 3A) and simplified partial top-down (FIG. 3B) views of another semiconductor device structure, in accordance with additional embodiments of the disclosure.
Figure 3B:
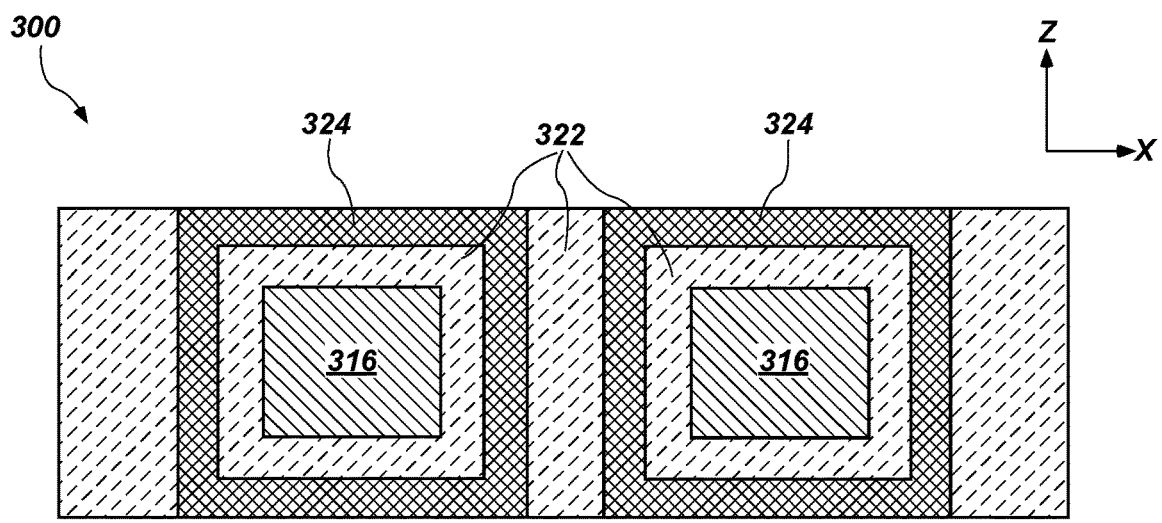

One of ordinary skill in the art will appreciate that, in accordance with additional embodiments of the disclosure, the features and feature configurations described above in relation to FIGS. 1A through 1F may be readily adapted to the design needs of different semiconductor devices (e.g., different memory devices). By way of non-limiting example, FIGS. 2 and 3A show simplified partial cross-sectional views of different semiconductor device structures, in accordance with additional embodiments of the disclosure. FIG. 3B shows a simplified partial top-down view of the semiconductor device structure depicted in FIG. 3A. Throughout the remaining description and the accompanying figures, functionally similar features (e.g., structures, devices) are referred to with similar reference numerals incremented by 100. To avoid repetition, not all features shown in the remaining figures (including FIGS. 2, 3A, and 3B) are described in detail herein. Rather, unless described otherwise below, a feature designated by a reference numeral that is a 100 increment of the reference numeral of a previously-described feature (whether the previously-described feature is first described before the present paragraph, or is first described after the present paragraph) will be understood to be substantially similar to the previously-described feature.

FIG. 2 illustrates a simplified partial cross-sectional view of a semiconductor device structure 200, in accordance with another embodiment of the disclosure. As shown in FIG. 2, the semiconductor device structure 200 is similar to the semiconductor device structure 100 shown in FIG. 1F, except each of the vertical transistors 226 thereof exhibits a different gate configuration than the vertical transistors 126 of the semiconductor device structure 100 depicted in FIG. 1F. The vertical transistors 226 each exhibit a "single-gate" configuration, such that each vertical transistor 226 includes only one (1) gate electrode 224 laterally neighboring the heterogeneous channel 214 (e.g., the middle region 214B of the heterogeneous channel 214) thereof. Put another way, only one (1) side of the heterogeneous channel 214 of the vertical transistor 226 has a gate electrode 224 laterally adjacent thereto. As shown in FIG. 2, an isolation structure 228 comprising an electrically insulating material may be provided laterally adjacent an opposing side of the heterogeneous channel 214 instead of another gate electrode 224. While the vertical transistors 226 of the semiconductor device structure 200 may exhibit a different gate configuration than the vertical transistors 126 of the semiconductor device structure 100 shown in FIG. 1F, the vertical transistors 226 benefit from the configurations of the heterogeneous channels 214 thereof (which are substantially similar to the heterogeneous channels 114 of the vertical transistors 126 previously described) in substantially the same manner as the vertical transistors 126 of the semiconductor device structure 100. For example, for each vertical transistor 226, the configuration of the heterogeneous channel 214 (including the configurations of the lower region 214A, the middle region 214B, and the upper region 214C) thereof may diminish (or even eliminate) Schottky barriers (e.g., electrostatic depletion layers) and promote Ohmic contact at junctions between the heterogeneous channel 214 and each of the source contact 204 and the drain contact 216 of the vertical transistor 226. The method of forming the semiconductor device structure 200 may be substantially similar to the method of forming the semiconductor device structure 100 previously described with reference to FIGS. 1A through 1F, except that one or more of a distance (e.g., spacing) between at least some laterally neighboring pillars 210 may be reduced and/or one or more masking processes may be employed to prevent the effectuation of a "double-gate" configuration.

FIG. 3A illustrates a simplified partial cross-sectional view of a semiconductor device structure 300, in accordance with another embodiment of the disclosure. FIG. 3B illustrates a simplified partial top-down view of the semiconductor device structure 300 shown in FIG. 3A. As shown in FIG. 3A, the semiconductor device structure 300 is similar to the semiconductor device structure 100 shown in FIG. 1F, except each of the vertical transistors 326 thereof exhibits a different gate configuration than the vertical transistors 126 of the semiconductor device structure 100 depicted in FIG. 1F. The vertical transistors 326 each exhibit a "gate-all-around" configuration, such that each vertical transistor 326 individually includes a single (e.g., only one) gate electrode 324 laterally surrounding all of the sidewalls (e.g., side surfaces) of the heterogeneous channel 314 (e.g., four (4) sidewalls if the heterogeneous channel 314 exhibits a rectangular cross-sectional shape). While the vertical transistors 326 of the semiconductor device structure 300 may exhibit a different gate configuration than the vertical transistors 126 of the semiconductor device structure 100 shown in FIG. 1F, the vertical transistors 326 benefit from the configurations of the heterogeneous channels 314 thereof (which are substantially similar to the heterogeneous channels 114 of the vertical transistors 126 previously described) in substantially the same manner as the vertical transistors 126 of the semiconductor device structure 100. For example, for each vertical transistor 326, the configuration of the heterogeneous channel 314 (including the configurations of the lower region 314A, the middle region 314B, and the upper region 314C) thereof may diminish (or even eliminate) Schottky barriers (e.g., electrostatic depletion layers) and promote Ohmic contact at junctions between the heterogeneous channel 314 and each of the source contact 304 and the drain contact 316 of the vertical transistor 326. The method of forming the semiconductor device structure 200 may be substantially similar to the method of forming the semiconductor device structure 100 previously described with reference to FIGS. 1A through 1F, except that deposition and patterning processes may be controlled to maintain at least some gate material around all of the sidewalls of the middle regions 314B of the heterogeneous channels 314 of the pillar structures 310.

Figure 4:
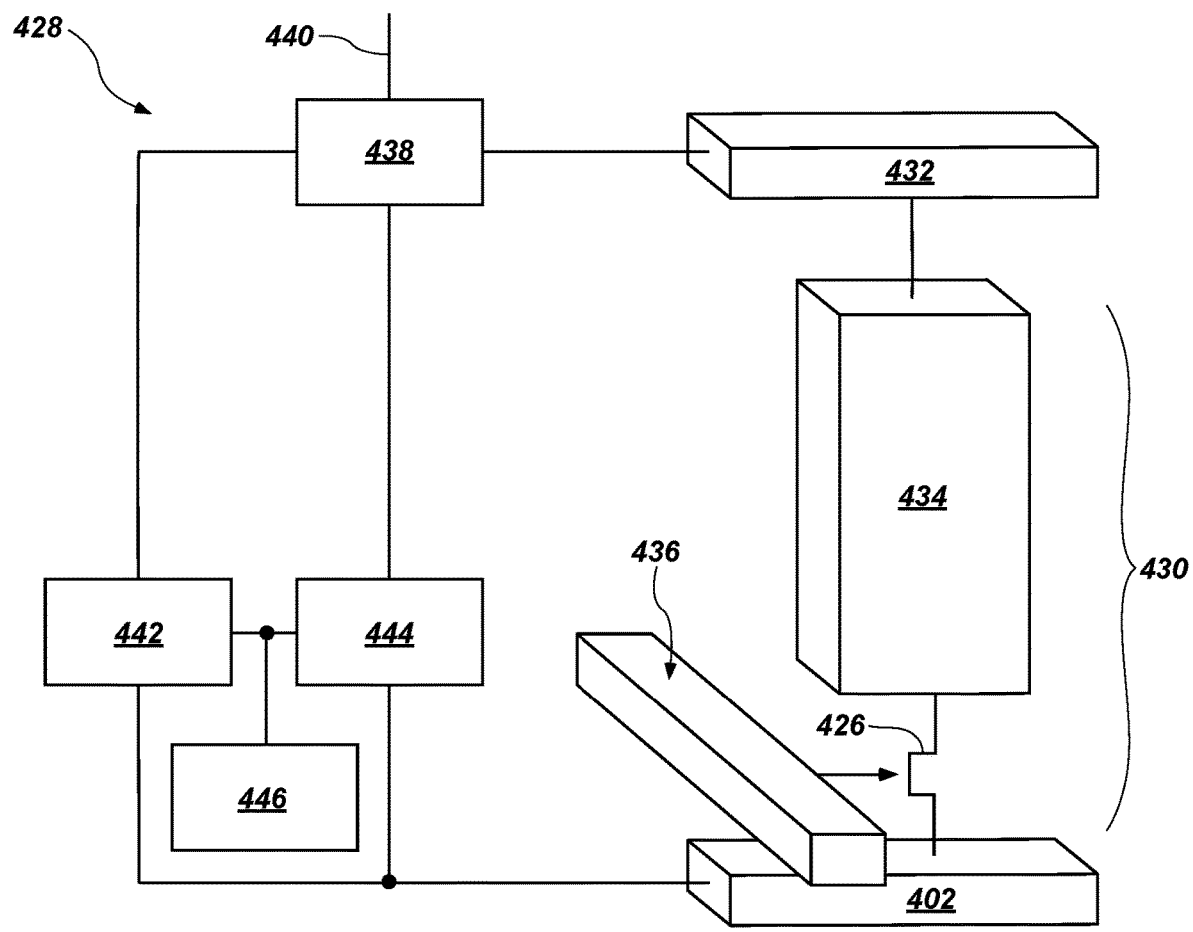
FIG. 4 is a functional block diagram of a memory device, in accordance with an embodiment of the disclosure.

FIG. 4 illustrates a functional block diagram of a memory device 428 in accordance with an embodiment of the disclosure. The memory device 428 may include, for example, an embodiment of a semiconductor device structure previously described herein (e.g., the semiconductor device structures 100, 200, 300). The memory device 428 may include at least one memory cell 430 between at least one data line 432 (e.g., bit line, data line) and at least one source line 402. The memory cell 430 may include a transistor 426 (e.g., a vertical transistor, such as one of the vertical transistors 126, 226, 326 previously described herein) coupled or connected in series with a memory element 434. The transistor 426 may act as a switch for enabling and disabling current flow through the memory element 434. By way of non-limiting example, the transistor 426 may be a transistor with at least one gate connected to an access line 436 (e.g., a word line). The access line 436 may extend in a direction substantially perpendicular to that of the data line 432. The data line 432 and the source line 402 may be connected to logic for programming and reading the memory element 434. A control multiplexer 438 may have an output connected to the data line 432. The control multiplexer 438 may be controlled by a control logic line 440 to select between a first input connected to a pulse generator 442, and a second input connection to read-sensing logic 444 (e.g., a sense amplifier).

During a programming operation, a voltage greater than a threshold voltage of the transistor 426 may be applied to the access line 436 to turn on the transistor 426. Turning on the transistor 426 completes a circuit between the source line 402 and the data line 432 by way of the memory element 434. After turning on the transistor 426, a bias generator 446 may establish, by way of the pulse generator 442, a bias voltage potential difference between the data line 432 and the source line 402. During a read operation, the bias generator 446 may establish, by way of read-sensing logic 444, a read bias voltage potential difference between the data line 432 and the source line 402. The read bias voltage may be lower than the reset bias voltage. The read bias voltage may enable current to flow through the memory element 434 according to a resistance state of an active material thereof. For example, for a given read bias voltage, if the active material is in a high-resistance state (e.g., a reset state), a relatively smaller current may flow through the memory element 434 than if the active material is in a low-resistance state (e.g., a set state). The amount of current flowing through memory element 434 during the read operation may be compared to a reference input by the read-sensing logic 444 to discriminate whether the data stored in the memory cell 430 is a logic "1" or a logic "0."

Thus, a memory device according to embodiments of the disclosure comprises an access line, a data line, a source line, and a memory cell between the data line and the source line. The memory cell comprises a vertical transistor and a memory element. The vertical transistor is electrically coupled to the access line and comprises an oxide semiconductor channel, a source contact, a drain contact, at least one gate electrode, and a gate dielectric material. The oxide semiconductor channel comprises a first region and a second region vertically adjacent the first region. The second region has a larger band gap than the first region. The source contact is vertically between the source line and the oxide semiconductor channel. The drain contact is on the oxide semiconductor channel. The at least one gate electrode laterally neighbors the second region of the oxide semiconductor channel and is electrically coupled to the access line. The gate dielectric material is between the oxide semiconductor channel and the at least one gate electrode. The memory element is between the data line and the drain contact of the vertical transistor.

Figure 5:
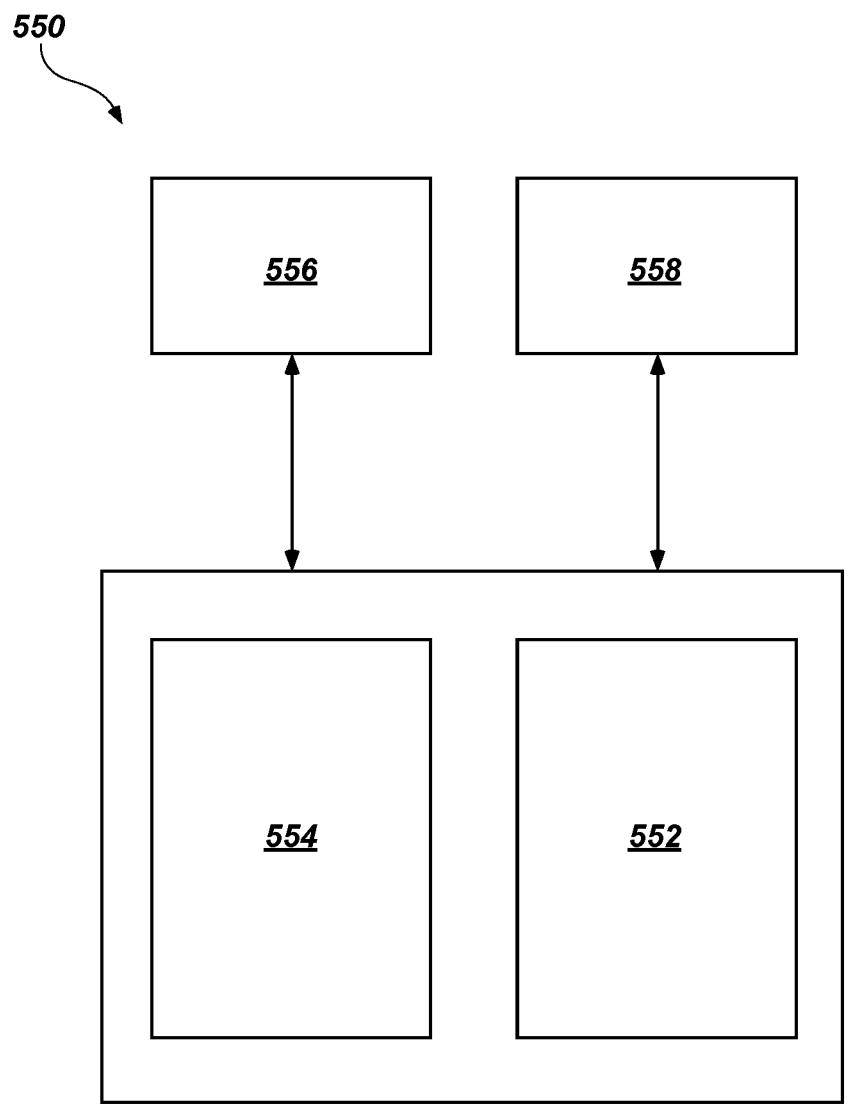
FIG. 5 is a schematic block diagram of an electronic system, in accordance with an embodiment of the disclosure.

Semiconductor device structures (e.g., the semiconductor device structures 100, 200, 300) and semiconductor devices (e.g., the memory device 428) in accordance with embodiments of the disclosure may be used in embodiments of electronic systems of the disclosure. For example, FIG. 5 is a block diagram of an illustrative electronic system 550 according to embodiments of disclosure. The electronic system 550 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 550 includes at least one memory device 552. The memory device 552 may comprise, for example, an embodiment of one or more of a semiconductor device structure (e.g., the semiconductor device structures 100, 200, 300) and a semiconductor device (e.g., the memory device 428) previously described herein. The electronic system 550 may further include at least one electronic signal processor device 554 (often referred to as a "microprocessor"). The electronic signal processor device 554 may, optionally, include an embodiment of a semiconductor device structure (e.g., the semiconductor device structures 100, 200, 300) and a semiconductor device (e.g., the memory device 428) previously described herein. The electronic system 550 may further include one or more input devices 556 for inputting information into the electronic system 550 by a user, such as, for example, a mouse or other pointing device, a keyboard, a touchpad, a button, or a control panel. The electronic system 550 may further include one or more output devices 558 for outputting information (e.g., visual or audio output) to a user such as, for example, a monitor, a display, a printer, an audio output jack, a speaker, etc. In some embodiments, the input device 556 and the output device 558 may comprise a single touchscreen device that can be used both to input information to the electronic system 550 and to output visual information to a user. The input device 556 and the output device 558 may communicate electrically with one or more of the memory device 552 and the electronic signal processor device 554.

Thus, an electronic system according to embodiments of the disclosure comprises an input device, an output device, a processor device operably coupled to the input device and the output device, and a memory device operably coupled to the processor device. The memory device comprises at least one transistor comprising a heterogeneous oxide semiconductor channel vertically between a metallic source contact and a metallic drain contact, the heterogeneous oxide semiconductor channel comprising an oxygen-rich, metal-lean middle region between at least two oxygen-lean, metal-rich end regions; and at least one gate electrode neighboring at least one side surface of the heterogeneous oxide semiconductor channel and substantially located within outermost vertical boundaries of the oxygen-rich, metal-lean middle region of the heterogeneous oxide semiconductor channel.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A transistor, comprising:
   a first conductive contact;
   a heterogeneous channel over the first conductive contact and comprising:
   a lower region directly contacting the first conductive contact;
   an upper region; and
   a middle region comprising a first oxide semiconductor material vertically between the lower region and the upper region,
   the middle region having one or more of a decreased atomic concentration of at least one metal, a decreased atomic concentration of at least one metalloid, and an increased atomic concentration of oxygen relative to the lower region and the upper region,
   one or more of the lower region and the upper region comprising a second oxide semiconductor material having a different material composition than the first oxide semiconductor material;

a second conductive contact over the heterogeneous channel and directly contacting the upper region of the heterogeneous channel; and a gate electrode laterally neighboring the heterogeneous channel.

2. The transistor of claim 1, wherein the lower region, the middle region, and the upper region each comprise substantially the same elements as one another.

3. The transistor of claim 1, wherein the lower region, the middle region, and the upper region are each substantially homogeneous.

4. The transistor of claim 1, wherein one or more of the lower region and the upper region is heterogeneous.

5. The transistor of claim 4, wherein amounts of one or more of at least one metal and at least one metalloid in the lower region and the upper region increase in directions extending vertically away from the middle region.

6. The transistor of claim 1, wherein one or more of the lower region and the upper region is doped with at least one element selected from hydrogen, nitrogen, phosphorus, boron, arsenic, and tellurium.

7. The transistor of claim 1, further comprising another gate electrode, the gate electrode and the another gate electrode laterally neighboring different sides of the heterogeneous channel than one another.

8. The transistor of claim 1, wherein the gate electrode laterally surrounds all lateral boundaries of heterogeneous channel.

9. The transistor of claim 1, wherein the heterogeneous channel comprises one or more of $Zn_xSn_yO$, $In_xZn_yO$, $Zn_xO$, $In_xGa_yZn_zO$, $In_xGa_ySi_zO_a$, $In_xW_yO$, $In_xO$, $Sn_xO$, $Ti_xO$, $Zn_xON_z$, $Mg_xZn_yO$, $Zr_xIn_yZn_zO$, $Hf_xIn_yZn_zO$, $Sn_xIn_yZn_zO$, $Al_xSn_yIn_zZn_aO$, $Si_xIn_yZn_zO$, $Al_xZn_ySn_zO$, $Ga_xZn_ySn_zO$, $Zr_xZn_ySn_zO$, and $In_xGa_ySi_zO$.

10. A transistor, comprising:
a first conductive contact;
a heterogeneous channel over the first conductive contact and comprising at least one oxide semiconductor material comprising:
a first region;
a second region; and
a third region vertically interposed between the first region and the second region, the third region oxygen-rich relative to each of the first region and the second region, and the first region and the second region each exhibiting a lower band gap than the third region;

a second conductive contact over the heterogeneous channel; and
a gate electrode laterally neighboring the heterogeneous channel.

11. The transistor of claim 10, wherein the first region and the second region are each metal-rich relative to the third region.

12. The transistor of claim 10, wherein one or more of the first region and the second region is relatively oxygen-rich and relatively metal-lean closer the third region and relatively oxygen-lean and relatively metal-rich farther away from the third region.

13. The transistor of claim 10, wherein:
one or more of the first region and the second region comprises $In_xGa_yZn_zO$; and
the third region comprises $In_xO$.

14. A transistor, comprising:
a first conductive contact;
a heterogeneous channel over the first conductive contact and comprising at least one oxide semiconductor material comprising:
a first region; and
a second region vertically adjacent the first region and having a larger band gap than the first region, the first region oxygen-lean relative to the second region;
a second conductive contact over the heterogeneous channel; and
a gate electrode laterally neighboring the heterogeneous channel.

15. The transistor of claim 14, wherein the at least one oxide semiconductor material of the heterogeneous channel further comprises a third region having a smaller band gap than the second region, the second region positioned vertically between the first region and the third region.

16. A transistor, comprising:
a first conductive contact comprising metallic material;
a heterogeneous channel over the first conductive contact and comprising at least one oxide semiconductor material comprising an oxygen-rich, metal-lean middle region between at least two oxygen-lean, metal-rich end regions;
a second conductive contact over the heterogeneous channel and comprising additional metallic material; and
a gate electrode laterally neighboring the heterogeneous channel.

* * * * *

UNITED STATES PATENT AND TRADEMARK OFFICE
CERTIFICATE OF CORRECTION

| | |
|---|---|
| PATENT NO. | : 11,515,417 B2 |
| APPLICATION NO. | : 16/596448 |
| DATED | : November 29, 2022 |
| INVENTOR(S) | : Scott E. Sills et al. |

It is certified that error appears in the above-identified patent and that said Letters Patent is hereby corrected as shown below:

In the Specification

Column 11, Line 36, change "a gate drain contact material" to --a drain contact material--

Signed and Sealed this
Fourth Day of July, 2023

Katherine Kelly Vidal
*Director of the United States Patent and Trademark Office*